(12) United States Patent
Sakai et al.

(10) Patent No.: US 8,648,976 B2
(45) Date of Patent: Feb. 11, 2014

(54) DISPLAY DEVICE AND MANUFACTURING METHOD THEREOF

(75) Inventors: Takeshi Sakai, Kokubunji (JP); Takuo Kaitoh, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 919 days.

(21) Appl. No.: 12/700,815

(22) Filed: Feb. 5, 2010

(65) Prior Publication Data

US 2010/0201608 A1    Aug. 12, 2010

(30) Foreign Application Priority Data

Feb. 6, 2009    (JP) .................................. 2009-025943

(51) Int. Cl.
*G02F 1/136* (2006.01)

(52) U.S. Cl.
USPC .............................. 349/43; 349/149; 345/204

(58) Field of Classification Search
None
See application file for complete search history.

(56) References Cited

U.S. PATENT DOCUMENTS

| | | | |
|---|---|---|---|
| 6,552,768 B1* | 4/2003 | Matsuda ....................... | 349/151 |
| 2003/0071803 A1* | 4/2003 | Yamazaki et al. ............ | 345/204 |
| 2008/0062112 A1* | 3/2008 | Umezaki ....................... | 345/100 |
| 2010/0177270 A1* | 7/2010 | Nakagawa .................... | 349/192 |

FOREIGN PATENT DOCUMENTS

| | | | |
|---|---|---|---|
| JP | 09-097909 A | * | 8/1997 |
| JP | 11-095257 A | * | 4/1999 |
| JP | 3089818 | | 7/2000 |

* cited by examiner

*Primary Examiner* — Bumsuk Won
*Assistant Examiner* — Ryan Crockett
(74) *Attorney, Agent, or Firm* — Antonelli, Terry, Stout & Kraus, LLP.

(57) ABSTRACT

A technique that can prevent breakdown of a thin film transistor due to static electricity is provided. A manufacturing method of a display device includes, in forming a plurality of thin film transistors constituting a drive circuit outside a display region as an assembly of pixels, forming a first wiring that is connected to gate electrodes of the thin film transistors to cause the thin film transistors to perform generating operation of a drive signal and a second wiring that connects gate electrodes of the thin film transistors adjacent to one another in the forming region of the drive unit in the same layer as the first wiring, and cutting the second wiring after forming the connected thin film transistors.

5 Claims, 7 Drawing Sheets

DISPLAY DEVICE AND MANUFACTURING METHOD THEREOF

CROSS-REFERENCE TO RELATED APPLICATION

The present application claims priority from Japanese application JP2009-025943 filed on Feb. 6, 2009, the content of which is hereby incorporated by reference into this application.

BACKGROUND OF THE INVENTION

1. Field of the Invention

The present invention relates to a display device and a manufacturing method thereof and more particularly to a display device in which a plurality of pixels and a drive circuit that drives the pixels are formed above a substrate and a manufacturing method thereof.

2. Background Art

Conventional liquid crystal display devices include a first substrate on which pixel electrodes and the like are formed, a second substrate disposed so as to face the first substrate, and a liquid crystal layer interposed between the first substrate and the second substrate. On the first substrate, in each of regions surrounded by a plurality of gate lines extending in the x-direction and arranged in parallel in the y-direction and a plurality of drain lines extending in the y-direction and arranged in parallel in the x-direction for example, a pixel is configured to include at least a thin film transistor controlled by a scanning signal from the gate line and the pixel electrode supplied with a video signal from the drain line via the thin film transistor. With this configuration, each of the pixels can be controlled independently, so that an image is displayed by these pixels. On the second substrate, a black matrix and color filters of R (red), G (green), and B (blue) corresponding to each of the pixels are formed, so that color display is performed according to the transmission amount of light transmitting the color filters.

On the other hand, a technique of forming a low-temperature polysilicon TFT (LTPS) as a thin film transistor has been established, and the LTPS is used as a thin film transistor for switching disposed in each of pixels. Further, it has become general to form a video signal drive circuit (drain driver) or a scanning signal drive circuit (gate driver) above the first substrate by using the LTPS. Along with an increase in the number of LTPSs formed in one liquid crystal display device as described above, the possibility of electrostatic breakdown of the LTPS is also increased in the course of the manufacture.

As a technique of protecting a thin film transistor against electrostatic breakdown, there is a liquid crystal display device disclosed in Patent Document 1, for example. In the liquid crystal display device disclosed in Patent Document 1, a capacitive electrode having a wide width is formed parallel to a gate bus line in a region near the side of a substrate, and after depositing a gate insulating layer, an end portion of a drain bus line formed on the film is formed so as to extend over the capacitive electrode. In a final stage of the manufacturing process, the region near the side is cut from the substrate, so that the drain bus line and the end portion are separated from each other.

Patent Document 1: Japanese Patent No. 3089818

SUMMARY OF THE INVENTION

In the display device disclosed in Patent Document 1, however, such a disadvantage has been pointed out that when a gate line is charged to cause electrostatic breakdown of a drain line facing the gate line in the capacitive electrode portion, the gate bus line and the drain bus line are short-circuited, and therefore a circuit operation test cannot be performed unless the capacitive portion and a panel main body are cut and separated from each other in a final step.

Moreover, the technique disclosed in Patent Document 1 is a technique for protecting a switching element for writing a charge corresponding to display data of a pixel against electrostatic breakdown. Therefore, there is a problem that the technique cannot be applied to a video signal drive circuit or a scanning signal drive circuit in which the gate electrodes and drain electrodes of thin film transistors are connected in a complicated manner.

The invention has been made to solve the problems, and it is an object of the invention to provide a technique that can prevent breakdown of a thin film transistor due to static electricity.

It is another object of the invention to provide a technique that can perform a circuit operation test before a cut-off step in the manufacturing stage of a liquid crystal display device.

Other objects of the invention will be apparent from the entire description of the specification.

In order to solve the problems, a first aspect of the invention is directed to a manufacturing method of a display device including a plurality of drain lines, a plurality of gate lines crossing the drain lines, a plurality of thin film transistors, a drive unit supplying the drain line and the gate line with a drive signal, and an electrode terminal inputting a control signal from the outside to the drive unit, in which each of regions surrounded by the drain lines and the gate lines is a region of a pixel. The method includes, in forming the plurality of thin film transistors of the drive unit, forming a second wiring that is a wiring in the same layer as a first wiring that connects the plurality of thin film transistors to one another to cause the thin film transistors to perform generating operation of the drive signal and is different from the first wiring to connect at least a pair of thin film transistors in an outside region of a display region as an assembly of the pixels, and cutting the second wiring after forming the thin film transistors in the outside region of the display region.

In order to solve the problems, a second aspect of the invention is directed to the manufacturing method of the display device according to the first aspect, wherein the second wiring is cut in forming a through hole in an insulating film formed on the upper surface of the electrode terminal so as to extend to the electrode.

In order to solve the problems, a third aspect of the invention is directed to the manufacturing method of the display device according to the first or second aspect, wherein the thin film transistor has a bottom gate structure in which a semiconductor layer is formed on the upper surface of a gate electrode, and the second wiring includes a wiring that connects the gate electrodes.

In order to solve the problems, a fourth aspect of the invention is directed to the manufacturing method of the display device according to the first or second aspect, wherein the second wiring includes a wiring that is connected to a drain electrode or a source electrode of the thin film transistor.

In order to solve the problems, a fifth aspect of the invention is directed to a display device including a plurality of drain lines, a plurality of gate lines crossing the drain lines, a plurality of thin film transistors, a drive unit supplying the drain line and the gate line with a drive signal, and an electrode terminal inputting a control signal from the outside to the drive unit, in which each of regions surrounded by the drain lines and the gate lines is a region of a pixel. The display device has, in an outside region of a display region as an assembly of the pixels, a second wiring that is a wiring in the same layer as a first wiring that connects the plurality of thin film transistors to one another to cause the thin film transistors to perform generating operation of the drive signal and is different from the first wiring, and a through hole that extends from an insulating film formed on the upper surface of the second wiring at least to the second wiring, wherein the second wiring is cut by the through hole.

According to the aspects of the invention, breakdown of a thin film transistor due to static electricity can be prevented. As a result, the yield of the product can be improved.

Moreover, a circuit operation test can be performed before a cut-off step in the manufacturing stage of a liquid crystal display device.

Other effects of the invention will be apparent from the entire description of the specification.

DESCRIPTION OF THE PREFERRED EMBODIMENTS

Figure 1:
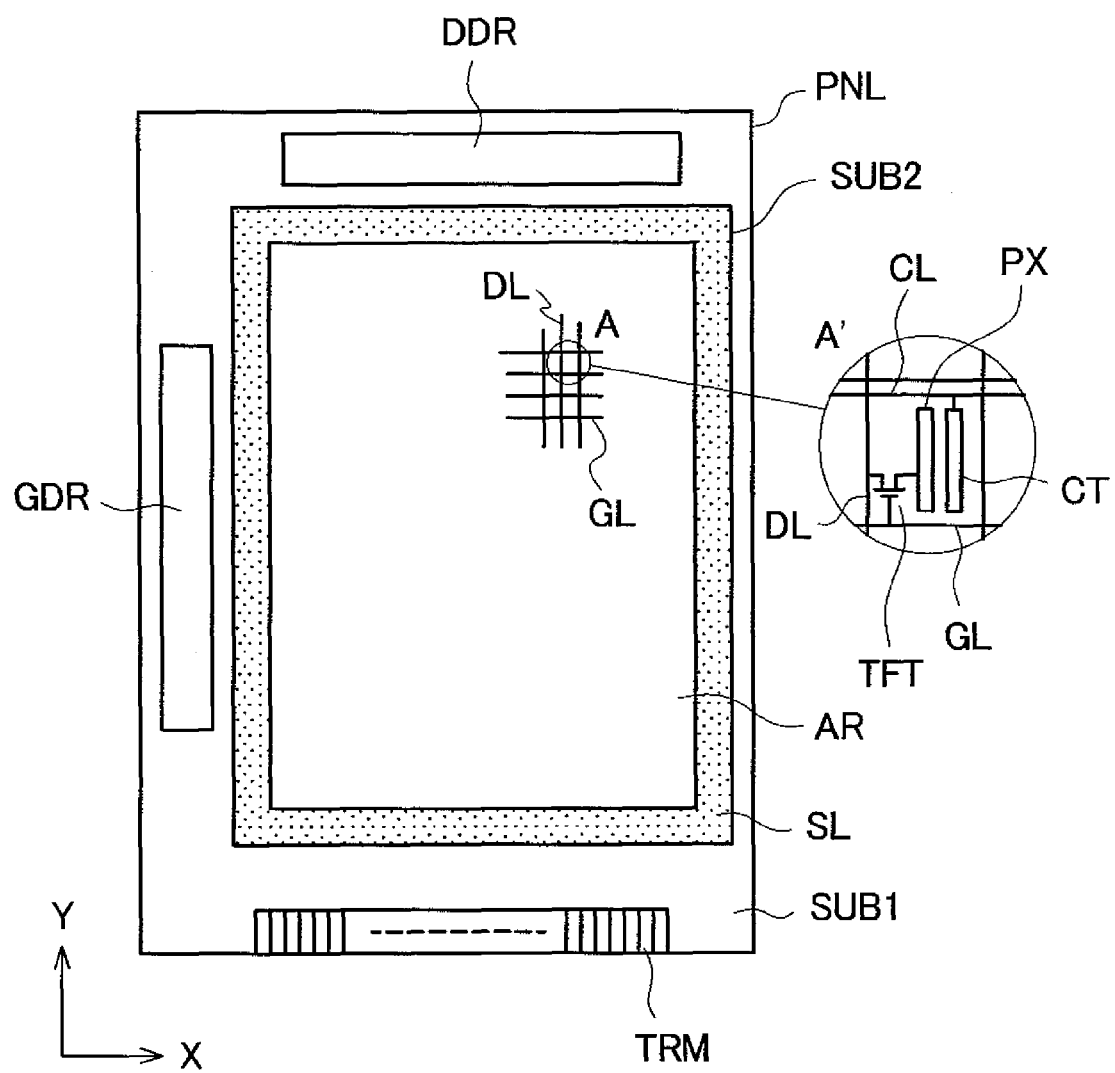
FIG. 1 is a plan view for explaining the schematic configuration of a liquid crystal display device as a display device of Embodiment 1 of the invention.

Hereinafter, embodiments to which the invention is applied will be described with reference to the drawings. In the description below, the same constituent elements are denoted by the same reference numerals, and the repetitive description thereof is omitted.

<Embodiment 1>
<Overall Configuration>

FIG. 1 is a plan view for explaining the schematic configuration of a liquid crystal display device as a display device of Embodiment 1 of the invention.

As shown in FIG. 1, the liquid crystal display device of Embodiment 1 has a liquid crystal display panel PNL including a semiconductor-device side substrate (TFT side substrate or first substrate) SUB1 on which pixel electrodes or the like are formed, a color-filter side substrate (CF side substrate or second substrate) SUB2 on which color filters described later or a black matrix (light shielding film) are formed and which is disposed so as to face the first substrate SUB1, and a not-shown liquid crystal layer interposed between the first substrate SUB1 and the second substrate SUB2. The liquid crystal display panel PNL and a not-shown backlight unit serving as a light source are combined together, so that the liquid crystal display device is completed. The first substrate SUB1 and the second substrate SUB2 are fixed together with a liquid crystal cell seal (sealing material) SL applied in a circular pattern at the peripheral portion of the second substrate SUB2. Liquid crystal interposed between the two substrates SUB1 and SUB2 is sealed also with the sealing material SL. In the description below, the term "liquid crystal display device" is also used for describing the liquid crystal display panel PNL.

The first substrate SUB1 and the second substrate SUB2 are not limited to, for example, well-known glass substrates but may be other insulating substrates made of quartz glass or plastic (resin). For example, since the use of quartz glass allows the process temperature to be increased, a gate insulating layer described later can be densified. Therefore, the reliability of a thin film transistor TFT described later can be improved. The use of a plastic (resin) substrate enables the provision of a liquid crystal display device that is lightweight and excellent in impact resistance.

In the liquid crystal display device of Embodiment 1, a region where display pixels (hereafter simply referred to as pixels) are formed inside a region where the liquid crystal is sealed serves as a display region AR. Accordingly, a region where the pixels are not formed and which is not involved in display does not serve as the display region AR even inside the region where the liquid crystal is sealed.

In the liquid crystal display device of Embodiment 1, a low-temperature polysilicon TFT (LTPS) is used as a thin film transistor TFT; a video signal drive circuit (drain driver) DDR is formed above the first substrate SUB1 in the upper portion of the drawing; and a scanning signal drive circuit (gate driver) GDR is formed above the first substrate SUB1 on the left side of the drawing. The drain driver DDR and the gate driver GDR will be described in detail later. In the description below, the drain driver DDR and the gate driver GDR are simply referred to as a drive circuit (driver) DR when they are not necessarily distinguished from each other.

As shown in FIG. 1, in the liquid crystal display device of Embodiment 1, on a surface of the first substrate SUB1 on the liquid crystal side and in the display region AR, scanning lines (gate lines) GL extending in the x-direction in the drawing and arranged in parallel in the y-direction are formed. Further, video signal lines (drain lines) DL extending in the y-direction in the drawing and arranged in parallel in the x-direction are formed.

Each of rectangular regions surrounded by the drain lines DL and the gate lines GL constitutes a region in which the pixel is formed. With this configuration, the pixels are arranged in a matrix in the display region AR. As shown in an enlarged view A' for example, in a circular portion A in FIG. 1, each of the pixels includes the thin film transistor TFT, a pixel electrode PX, and a common electrode CT. The thin film transistor TFT is turned on by a scanning signal from the gate line GL. The pixel electrode PX is supplied with a video signal from the drain line DL via the turned-on thin film transistor TFT. The common electrode CT is connected to a common line CL and supplied with a reference signal having a potential serving as a reference to the potential of the video signal. In the configuration of the common electrode CT shown in the enlarged view A', the reference signal is input to the common electrode CT that is formed independently for each pixel via the common line CL. However, this is not restrictive. As will be described later, the common electrode CT may be formed such that the common electrodes CT of the pixels arranged adjacent to one another in the x-axis direction are directly connected, so that the reference signal is input from one right or left end (end portion of the first substrate SUB1) in the x-axis direction, or from both ends via the common line CL.

In Embodiment 1, the drain lines DL and the gate lines GL are extended to cross the liquid crystal cell seal SL respectively at the upper end thereof and at the left end thereof and are connected respectively to the drain driver DDR and the gate driver GDR. As described above in Embodiment 1, the drain driver DDR or the gate driver GDR that is a driver for the liquid crystal display device is formed above the first substrate SUB1 with LTPS. Control signals including drive signals of the drain driver DDR and the gate driver GDR are input to the drivers DDR and GDR via a not-shown flexible printed circuit that is connected to an electrode terminal formed in a terminal region TRM shown at the lower end in the drawing.

<Pixel Configuration>

Figure 2:
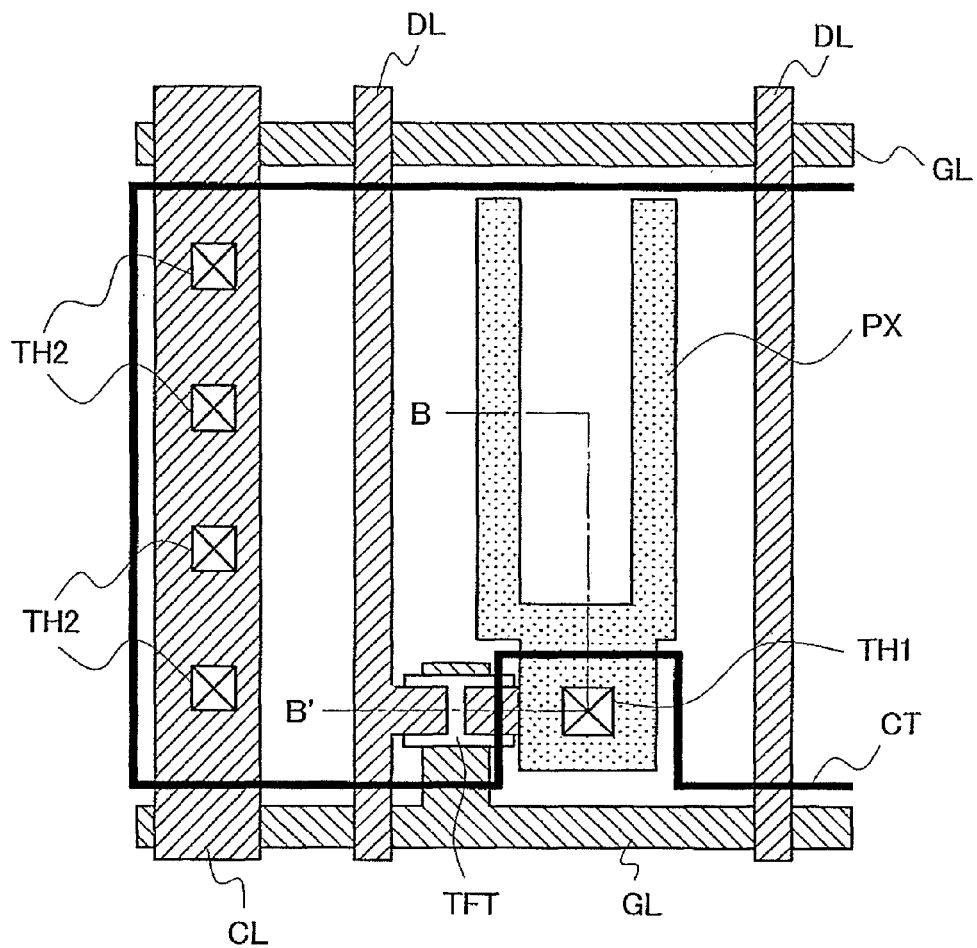
FIG. 2 is a plan view for explaining the schematic configuration of a pixel in the liquid crystal display device as the display device of Embodiment 1 of the invention.
Figure 3:
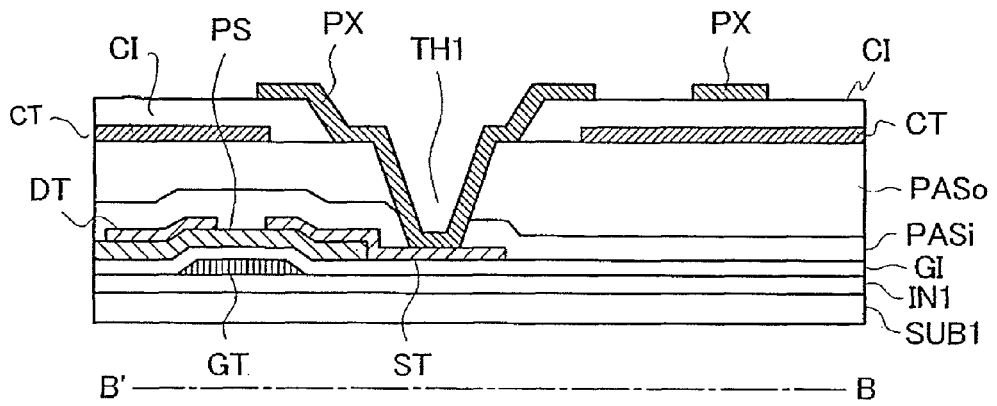
FIG. 3 is a cross-sectional view taken along line B-B' of FIG. 2.

FIG. 2 is a plan view for explaining the schematic configuration of a pixel in the liquid crystal display device as the display device of Embodiment 1 of the invention. FIG. 3 is a cross-sectional view taken along line B-B" of FIG. 2. Since thin films shown below can be formed by a heretofore known photolithography technique, the detailed description of the forming method is omitted. For simplifying the description, an alignment film, a polarizer, and the like are omitted.

As shown in FIG. 2, the gate lines GL and the drain lines DL are formed in parallel with a relatively large distance on the surface of the first substrate SUB1 on the liquid crystal side.

In the region surrounded by the gate lines GL and the drain lines DL, the common electrode CT formed of a transparent conductive material such as, for example, ITO (Indium-Tin-Oxide) is formed. The transparent electrode CT is formed so as to overlap the common line CL at a side portion thereof on the common-line-CL side and is electrically connected to the common line CL via contact holes CH2. Although the case of using ITO as a transparent conductive film is described, the transparent conductive film is not limited to one formed of ITO. A heretofore known ZnO transparent conductive film may be used.

As shown in FIG. 3, on the surface of the first substrate SUB1, an insulating film IN1 serving as an under layer is formed for blocking the intrusion of ions such as Na (sodium) or K (potassium) from the first substrate SUB1 into the thin film transistor TFT. As the insulating film IN1, a thin film having, for example, a layer formed of silicon nitride and a layer formed of silicon oxide stacked in this order from the first-substrate-SUB1 side can be used. However, this is not restrictive.

On the upper surface of the insulating film IN1, the gate line GL, a gate electrode GT, and the common line CL are formed. An insulating film GI is formed thereon so as to cover the gate line, the gate electrode, and the common line. The insulating film GI functions as a gate insulating layer of the thin film transistor TFT described later in the forming region of the thin film transistor TFT, according to which the thickness of the insulating film and the like is set.

On the upper surface of the insulating film GI, a semiconductor layer PS formed of low-temperature polysilicon is formed at a portion partially overlapping the gate line GL. The semiconductor layer PS serves as a semiconductor layer of the thin film transistor TFT.

The semiconductor layer before converting to polysilicon is formed, in addition to the forming region of the thin film transistor TFT, as an amorphous silicon layer under the drain line DL, under an extended portion that electrically connects the drain line DL with a drain electrode DT of the thin film transistor TFT, and under a portion (including a pad PD) of a source electrode ST of the thin film transistor TFT extending over the forming region of the thin film transistor TFT. The semiconductor layer is formed with a small level difference in, for example, the drain line DL.

The drain line DL is formed so as to extend in the vertical direction in FIG. 2. The drain line DL has an extended portion that is extended to the thin-film-transistor-TFT side at a part thereof. The extended portion is connected to the drain electrode DT of the thin film transistor TFT formed on the semiconductor layer PS. The drain line DL that is formed so as to extend in the vertical direction in FIG. 2 crosses the gate line GL via the insulating film IN1 and a not-shown amorphous silicon layer in the region near the thin film transistor TFT.

The source electrode ST that is formed simultaneously when the drain line DL and the drain electrode DT are formed faces the drain electrode DT on the semiconductor layer PS and has an extended portion slightly extended from above the semiconductor layer PS to the pixel region side. The extended portion is extended to the pad PD connected to the pixel electrode PX described later.

The thin film transistor TFT of Embodiment 1 has a so-called inversely staggered MIS (Metal Insulator Semiconductor) structure. In a transistor having the MIS structure, the drain electrode DT and the source electrode ST are driven so as to be switched to each other depending on the application of bias. In the description of this specification, however, one connected to the drain line DL is referred to as the drain electrode DT, while the other connected to the pixel electrode PX is referred to as the source electrode ST, for convenience.

On the drain electrode DT and the source electrode ST, that is, on the thin film transistor TFT, a protective film PASi formed of an inorganic compound and covering the thin film transistor TFT and a planarization film PASo formed of an organic insulating film and having a function as a planarization film are formed. The protective film PASi protects the thin film transistor TFT against an alkaline component of liquid crystal or the planarization film PASo and formed of, for example, a silicon nitride (SiN) film or the like as an inorganic material. The protective film PASi is formed on the entire upper surface of the thin film transistor TFT. The planarization film PASo is formed on the upper surface of the protective film PASi (liquid crystal side of the substrate) by a heretofore known spin coating method. For example, the planarization film PASo is formed of an organic material such as a photosensitive polyimide or acrylic resin and planarizes the irregularities of the upper surface of the first substrate SUB1 caused by the formation of the thin film transistor TFT, the gate line GL, the drain line DL, the common line CL, and the like. In the first substrate SUB1 of the liquid crystal display device of Embodiment 1, the protective film PASi and the planarization film PASo constitute a protective film.

The common electrode CT is formed on the upper surface of the planarization film PASo, and a capacitor insulating film CI is formed on the upper surface of the common electrode. A through hole (contact hole) TH1 extending to the pad that is extended from the source electrode is formed in the capacitor insulating film CI, the planarization film PASo, and the protective film PASi. Therefore, the pixel electrode PX formed on the upper surface of the capacitor insulating film CI and the source electrode ST are electrically connected to each other.

In the liquid crystal display device of Embodiment 1 as described above, the pixel electrode PX is disposed via the capacitor insulating film CI formed on the upper surface of the common electrode CT. In the thus formed liquid crystal display device (liquid crystal display device of lateral electric field system), the pixel electrode PX and the common electrode CT generally function also as a pair of electrodes for forming a holding capacitance. That is, the capacitor insulating film CI is used as an inter-layer insulating film formed between the pixel electrode PX and the common electrode CT, so that the pixel electrode PX and the common electrode CT realize a holding capacitance necessary for holding a pixel charge while realizing the insulation between the pixel electrode PX and the common electrode CT.

<Configuration of Drive Circuit>

Figure 4:
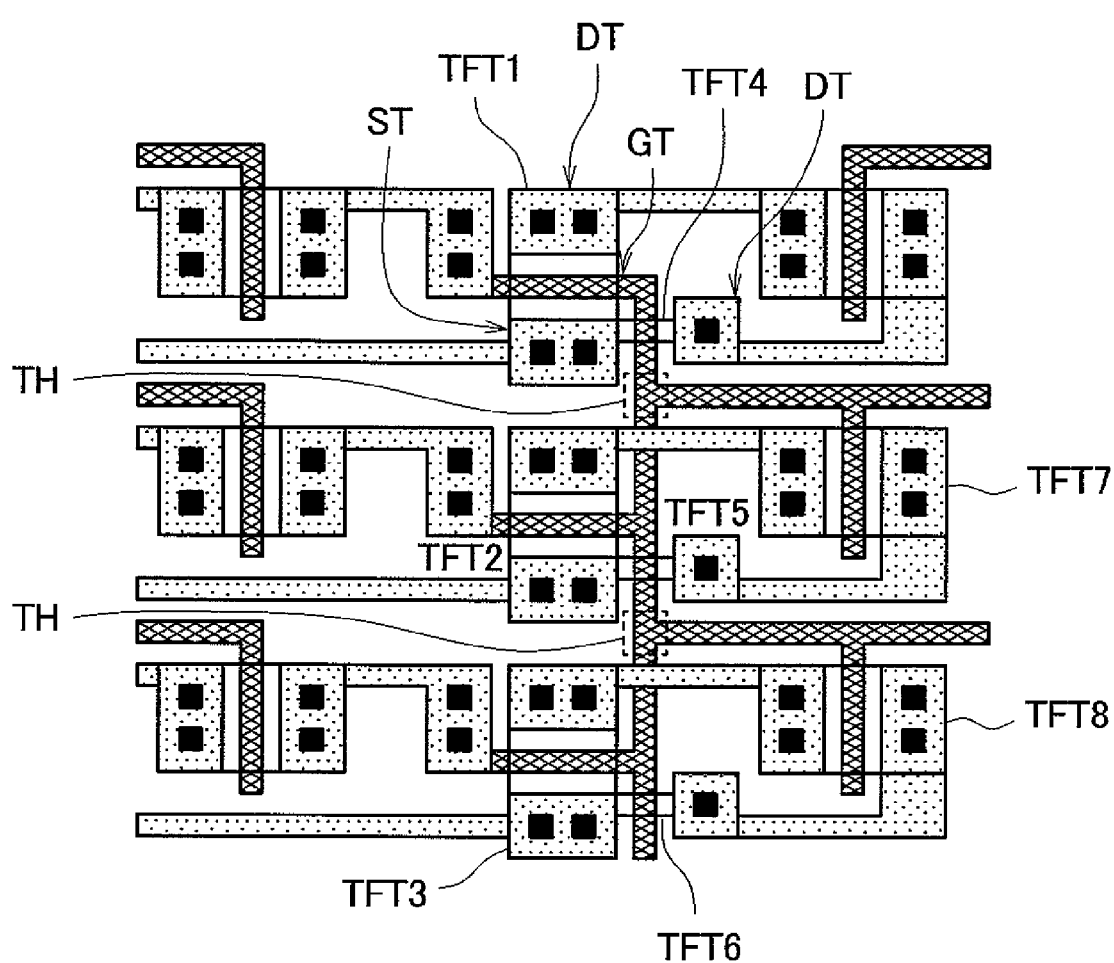
FIG. 4 explains the schematic configuration of a drive circuit in the display device of Embodiment 1 of the invention.
Figure 5:
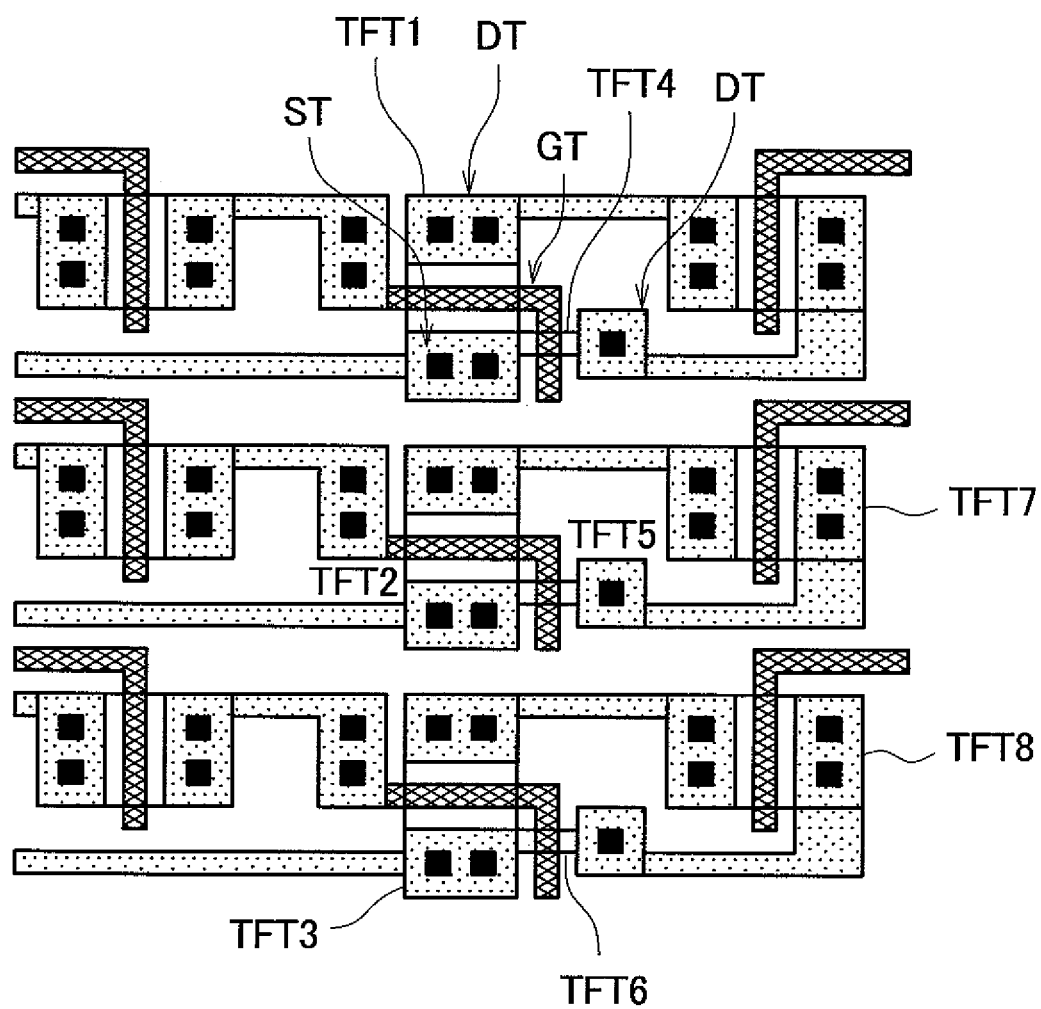
FIG. 5 explains the schematic configuration of a drive circuit in a conventional display device.

FIG. 4 explains the schematic configuration of a drive circuit in the display device of Embodiment 1 of the invention. FIG. 5 explains the schematic configuration of a drive circuit in a conventional display device. The drive circuit pattern shown in FIG. 4 shows a circuit pattern before a cutting step of cutting a gate wiring as a feature of the invention. In the description of the drive circuit of Embodiment 1, for clearly distinguishing from a source line SL, the drain line DL, and the gate line GL in the display region AR, the source electrode ST, the drain electrode DT, and the gate electrode GT sometimes include signal lines extended from the source electrode ST, the drain electrode DT, and the gate electrode GT of each of the thin film transistors TFT.

In the conventional drive circuit as shown in FIG. 5, one end of the gate electrode of each of thin film transistors TFT1 to 6 is connected to a drain electrode of a thin film transistor formed on the left side in the drawing. On the other hand, the other end of the gate electrode of each of the thin film transistors 1 to 6 is not connected to any of the other transistors. For example, only one end of the gate electrode GT common to the thin film transistors TFT1 and TFT2 is connected to a drain electrode of a thin film transistor on the left side of the TFT 1 in the drawing, but the other end is not connected to any of the thin film transistors.

As is apparent from FIG. 4, on the other hand, in the drive circuit to which the invention is applied, the gate electrodes GT of thin film transistors 1 to 8 are connected with a conductive film that is formed in the same step as the gate electrode GT. That is, in the drive circuit of Embodiment 1, when gate electrodes serving as the gate electrodes GT of the thin film transistors TFT 1 to 8 and a wiring pattern thereof are formed, a wiring pattern that connects the gate electrodes GT of the thin film transistors TFT 1 to 8 adjacent to one another is also formed. Therefore, the gate electrodes GT of the thin film transistors 1 to 8 are connected without adding a new step.

In the drive circuit of Embodiment 1 in this case, the gate electrodes GT that have to be separated from one another originally in view of circuit operation among all the thin film transistors TFT 1 to 8 whose gate electrodes GT are connected are separated from one another by partially cutting the wiring pattern in a step of exposing the electrode terminal of the terminal region TRM. In the drive circuit of Embodiment 1, a through hole (contact hole) TH by which at least the upper surface of the insulating film IN1 is exposed from the liquid crystal side of the first substrate SUB1 and the wiring pattern is cut is formed at a cutting portion indicated by a dotted-line square in FIG. 4. Therefore, the gate electrodes GT that are not originally connected electrically are separated from one another. With the formation of the through hole TH, the circuit configuration has the same circuit pattern as that shown in FIG. 5.

Figure 6:
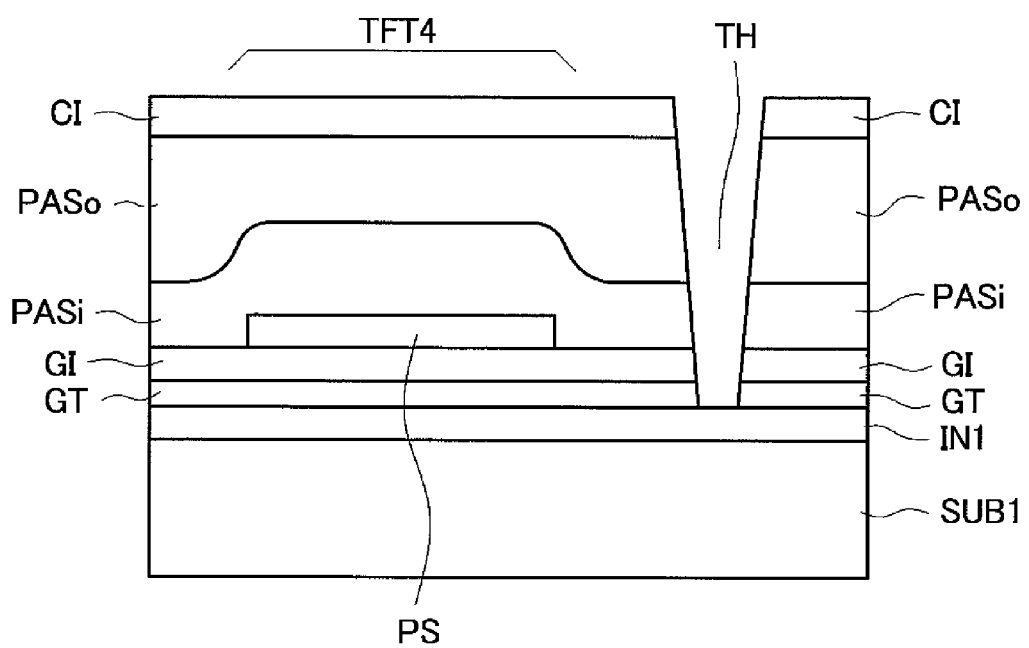
FIG. 6 is a cross-sectional view for explaining the schematic configuration of gate electrodes separated from each other in the drive circuit of Embodiment 1 of the invention.

FIG. 6 is a cross-sectional view for explaining the schematic configuration of gate electrodes separated from each other in the drive circuit of Embodiment 1 of the invention. FIGS. 7A to 7D show a flow sheet of an embodiment of a manufacturing method for forming the drive circuit of Embodiment 1 of the invention. Here, FIG. 6 is a cross-sectional view along the extending direction of the gate electrode GT of the thin film transistor TFT4 shown in FIG. 4.

As shown in FIG. 6, the drive circuit of Embodiment 1 is formed above the first substrate SUB1 constituting the liquid crystal display panel. Therefore, each of the thin film transistors constituting the drive circuit has an inverse staggered structure similarly to the thin film transistor formed in the display region. Accordingly, the gate electrode GT formed on the upper surface of the gate insulating layer IN1, that is, on the liquid-crystal-surface side and the wiring pattern connected to the gate electrode GT are formed in an early stage in the process for forming the thin film transistor. As a result, in the drive circuit of Embodiment 1, it is possible to provide an excellent effect that can prevent electrostatic breakdown of a thin film transistor from an early stage of the process.

As is apparent from FIG. 6, the drive circuit of Embodiment 1 is formed above the first substrate SUB1. Therefore, the capacitor insulating film CI is also formed on the upper surface of the protective film PASi and the planarization film PASo for protecting the thin film transistor similarly to the terminal region TRM. Accordingly, when the pattern connecting the gate electrodes GT is cut by a hole forming step of the terminal region TRM that is a step after the formation of the pixel electrode PX, the through hole TH extending from the capacitor insulating film CI to the insulating film IN1 is formed. In the cutting step, only the wiring pattern formed in the same layer as the gate electrode and connecting the gate electrodes that are not originally connected is cut. As shown in FIG. 6, therefore, the cutting is made in a region where a pattern for other signals is not formed on the upper surface of the pattern wiring at the cutting portion.

<Manufacturing Process of Thin Film Transistor>

Next, based on FIGS. 6 and 7A to 7D, a manufacturing method of a thin film transistor constituting the drive circuit of Embodiment 1 will be described in the order of steps. Since the formation of thin films including the formation of electrodes in each step is possible by a heretofore known photolithography technique, the detailed description thereof is omitted. Moreover, a manufacturing method of a pixel in the display region AR is omitted.

Figure 7A:
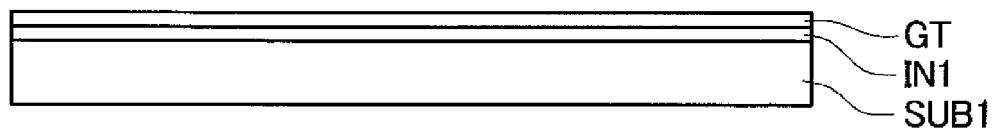
FIGS. 7A to 7D show a flow sheet showing an embodiment of a manufacturing method for forming the drive circuit of Embodiment 1 of the invention.

Step 1. (FIG. 7A)

On a surface of the first substrate SUB1 on the upper surface side (liquid crystal side), the under film IN1 and the gate electrode GT are formed of, for example, a molybdenum tungsten (MoW) thin film. In a pattern of the gate electrode GT formed in Step 1, not only the gate electrodes GT of the thin film transistors that are originally connected but also the gate electrodes GT of the thin film transistors adjacent to one another in the forming region of the drive circuit are electrically and physically connected.

In Step 1, the gate line GL, the gate electrode GT of a thin film transistor for switching that is connected to a pixel, and the common line CL are formed in the display region AR. Especially the gate line GL is formed so as to extend from the display region AR to the scanning signal drive circuit.

Further in Step 1, an electrode terminal is formed in the terminal region TRM, and a wiring connecting the electrode terminal with the thin film transistor TFT of the drive circuit is also formed.

Figure 7B:
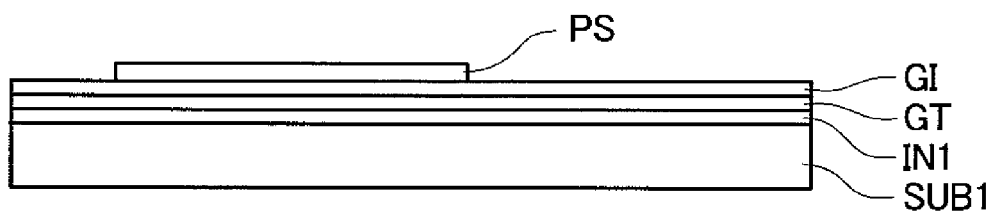

Step 2. (FIG. 7B)

The semiconductor layer PS formed of low-temperature polysilicon is formed on the upper surface of the gate electrode GT at a portion partially overlapping the gate electrode GT. The semiconductor layer PS serves as a semiconductor layer of the thin film transistor TFT. After forming the semiconductor layer PS, the drain electrode DT and the source electrode ST, both not shown, are formed on the upper surface of the gate electrode GT such that the drain electrode DT and the source electrode ST face each other on the semiconductor layer PS, whereby the thin film transistor TFT of a polysilicon TFT is formed.

Figure 7C:
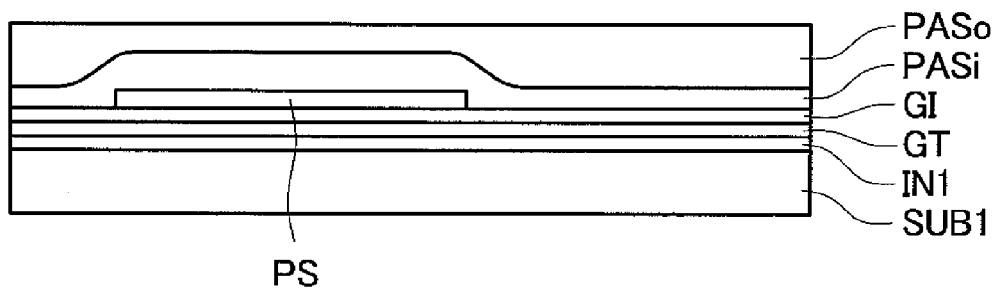

Step 3 (FIG. 7C)

The protective film PASi formed of a silicon nitride film (SiN film) as an inorganic material for protecting the thin film transistor TFT is formed on the entire surface of the first substrate SUB1 on the upper surface side, thereby serving as a protective film of the thin film transistors TFT including those in the display region AR. The planarization film PASo formed of an acrylic film is formed on the upper surface of the protective film PASi (liquid crystal side of the substrate) on the upper surface side of the first substrate SUB1 by a heretofore known spin coating method or the like to planarize the irregularities on the upper surface of the first substrate SUB1 caused by the formation of the thin film transistors TFT of the drive circuit as well as the thin film transistors TFT, the gate line GL, the drain line DL, the common line CL and the like formed in the display region AR. In the first substrate SUB1 of the display device of Embodiment 1, the protective film PASi and the planarization film PASo constitute a protective insulating film.

Figure 7D:
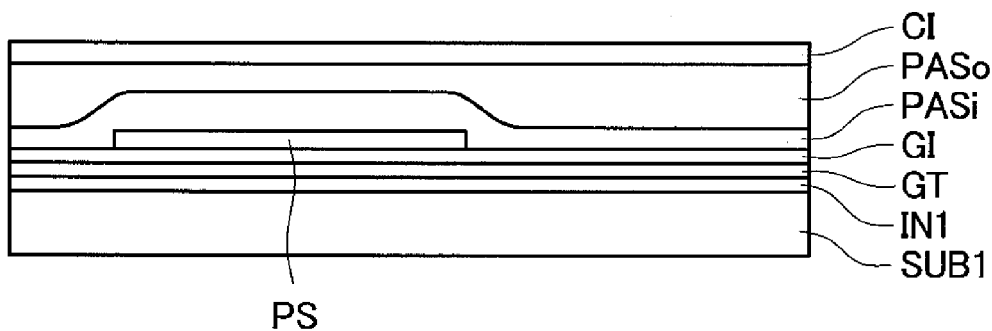

Step 4. (FIG. 7D)

A coating type insulating film is deposited, and a baking treatment is performed by heating at about 200 degree, whereby the capacitor insulating film CI is formed on the upper surface of the first substrate SUB1. The capacitor insulating film CI is an insulating film formed between the common electrode CT and the pixel electrode PX in each pixel and is extended to the drive circuit region. In Step 4, along with the formation of the capacitor insulating film CI, the formation of the common electrode CT and the pixel electrode PX, the electrical connection between the common line CL and the common electrode CT, and the electrical connection between the source electrode ST of the thin film transistor TFT and the pixel electrode PX are performed.

Step 5. (FIG. 6)

Step 5 is a step of forming a through hole in a region on the electrode formed in the terminal region PRM and exposing the electrode terminal, that is, a hole forming step of the terminal region TRM. In Embodiment 1, the connection between the gate electrodes GT unnecessary for the drive circuit operation is cut, and only the connection between the gate electrodes GT of the thin film transistors that are originally connected is left. Therefore, the drive circuit DR (video signal drive circuit DDR and scanning signal drive circuit GDR) that can achieve a desired operation is formed.

As described above, in the display device of Embodiment 1 of the invention, when the plurality of thin film transistors TFT forming the drive circuit DR are formed, not only a first wiring that is a wiring connecting the gate electrodes GT of the thin film transistors that are originally connected but also a second wiring electrically and physically connecting the gate electrodes GT of the thin film transistors adjacent to one another in the forming region of the drive circuit are formed in an outside region of the display region AR in Step 1. In Step 5 as a step after the formation of the thin film transistors TFT, the second wiring connecting the gate electrodes GT of the thin film transistors adjacent to one another in the forming region of the drive circuit is cut in the forming region of the drive circuit DR as the outside region of the display region AR. Therefore, it is possible to reduce regions electrically independent from one another in the forming steps of the thin films in Steps 2 to 4. As a result, the breakdown of the thin film transistor TFT due to static electricity can be prevented. Accordingly, the manufacturing yield of the display device as a product can be improved.

Further in Step 5 of forming the hole of the terminal region TRM before the cut-off step in the manufacturing stage of the liquid crystal display device, the second wiring connecting the gate electrodes GT of the thin film transistors adjacent to one another is cut. Therefore, a circuit operation test can be performed before the cut-off step.

In FIG. 4, the gate electrode GT of each of the thin film transistors disposed in the vertical direction on the leftmost side in the drawing is not connected to the gate electrode GT of another thin film transistor. However, the gate electrodes GT of the thin film transistors in the vertical direction may be connected similarly to the thin film transistors TFT1 to 6. Further, the gate electrode GT to which the thin film transistors are connected may be connected to the gate electrode GT of the thin film transistor TFT1. When the gate electrodes GT of the thin film transistors are connected, the wiring required for the connection has to be cut in a later step for separating the connected gate electrodes GT similarly to the thin film transistors 1 to 8.

<Embodiment 2>
<Configuration of Drive Circuit>

Figure 8:
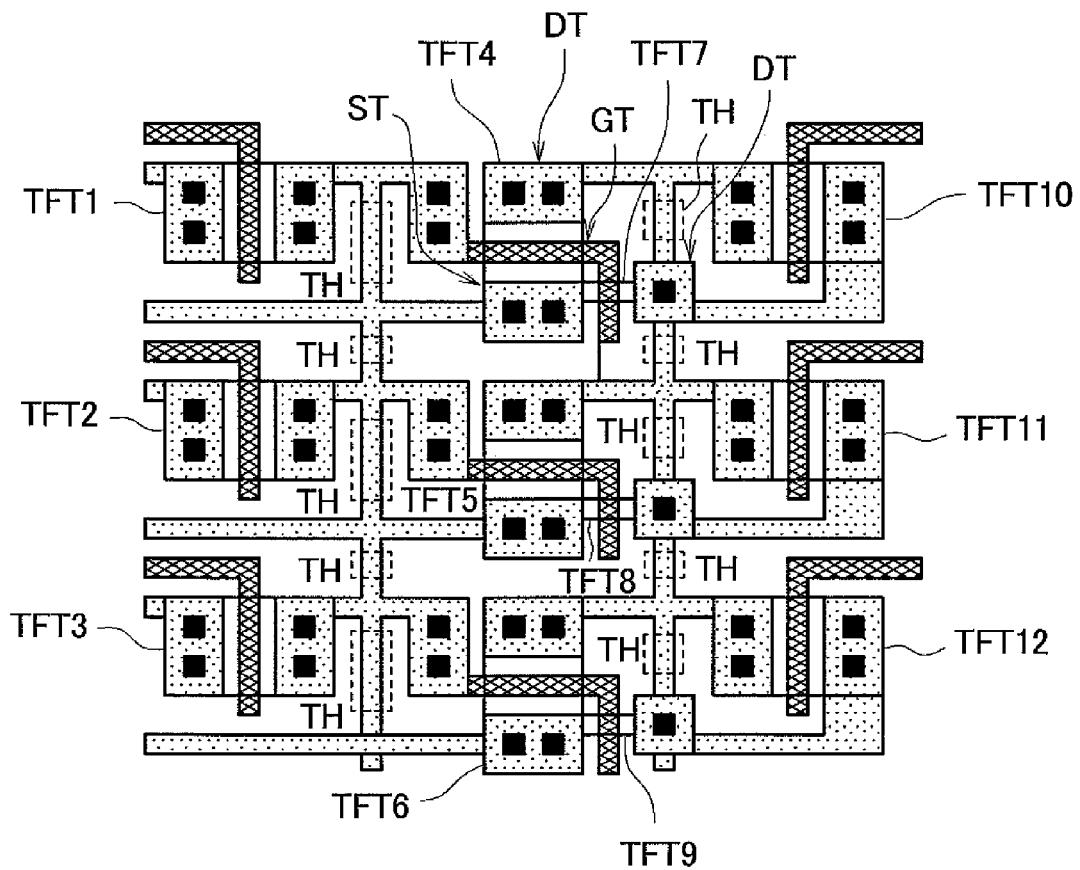
FIG. 8 explains the schematic configuration of a drive circuit in a display device of Embodiment 2 of the invention.

FIG. 8 explains the schematic configuration of a drive circuit in a display device of Embodiment 2 of the invention. The drive circuit pattern shown in FIG. 8 shows a circuit pattern before a cutting step of cutting a drain wiring and a source wiring as a feature of Embodiment 2. Also in the description of the drive circuit of Embodiment 2, similarly to Embodiment 1, for clearly distinguishing from the source line SL, the drain line DL, and the gate line GL in the display region AR, the source electrode ST, the drain electrode DT, and the gate electrode GT sometimes include signal lines extended from the source electrode ST, the drain electrode DT, and the gate electrode GT of each of the thin film transistors TFT. Further, since the forming procedure of a thin film transistor except for a pattern for a wiring connecting the drain electrodes DT and/or the source electrodes ST adjacent to one another is the same as Embodiment 1, the detailed description thereof is omitted.

As is apparent from FIG. 8, in the drive circuit of Embodiment 2, the drain electrodes DT and the source electrodes ST that are formed in the same layer in thin film transistors 1 to 12 are connected with a conductive film that is formed in the same step as the drain electrode DT and the source electrode ST. That is, in the drive circuit of Embodiment 2, when an electrode pattern serving as the drain electrode DT or the source electrode ST in each of the thin film transistors TFT1 to 12 and a wiring pattern thereof are formed, a wiring pattern connecting to the drain electrodes DT or the source electrodes ST of the thin film transistors TFT1 to 12 adjacent to one another is also formed. Therefore, both or either of the drain electrodes DT and the source electrodes ST of the thin film transistors 1 to 12 are connected without adding a new step.

In the drive circuit of Embodiment 2 in this case, the drain electrodes DT of the thin film transistors TFT1 to 3 and the source electrodes ST of the thin film transistors TFT4 to 6 are connected, and the drain electrodes DT of the thin film transistors TFT4 to 6, the drain electrodes DT of the thin film transistors TFT7 to 9, and the source electrodes ST and the drain electrodes DT of the thin film transistors 10 to 12 are connected. Similarly to Embodiment 1 described above, however, the drain electrodes DT and the source electrodes ST that have to be separated from one another in view of the original circuit operation among all the thin film transistors TFT1 to 12 whose drain electrodes DT and/or source electrodes ST are connected are separated from one another in a step of exposing the electrode of the terminal region TRM by partially cutting the wiring pattern. That is, in the drive circuit of Embodiment 2, the through hole (contact hole) TH by which at least the upper surface of the insulating film IN1 is exposed from the liquid crystal side of the first substrate SUB1 and the wiring pattern is cut is formed at a cutting portion indicated by a dotted-line square in FIG. 8. Therefore, the drain electrode DT and the source electrode ST that are not originally connected electrically are separated from one another. With the formation of the through hole TH, the circuit configuration has the same circuit pattern as that shown in FIG. 5.

Figure 9:
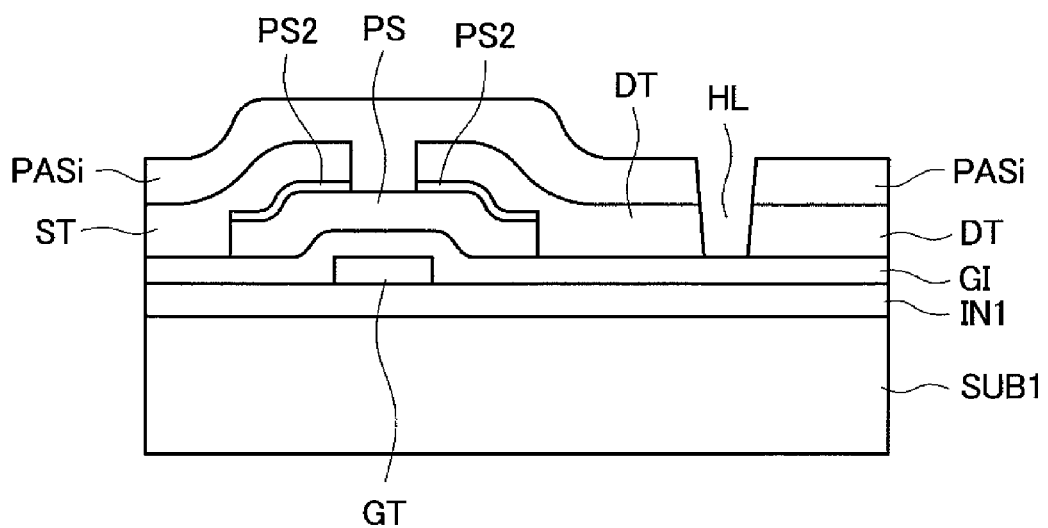
FIG. 9 is a cross-sectional view for explaining the schematic configuration of drain electrodes separated from each other in the drive circuit of Embodiment 2 of the invention.

FIG. 9 is a cross-sectional view for explaining the schematic configuration of drain electrodes separated from each other in the drive circuit of Embodiment 2 of the invention. FIG. 9 is a cross-sectional view along the extending direction of the drain electrode DT of the thin film transistor TFT4 shown in FIG. 8.

As shown in FIG. 9, the drive circuit of Embodiment 2 is formed above the first substrate constituting the liquid crystal display panel. Therefore, each of the thin film transistors constituting the drive circuit has an inverse staggered structure similarly to the thin film transistor formed in the display region.

As is apparent from FIG. 9, the drive circuit of Embodiment 2 is formed above the first substrate SUB1. Therefore, the capacitor insulating film CI is also formed on the upper surface of the protective film PASi and the planarization film PASo for protecting the thin film transistor similarly to the terminal region TRM. Accordingly, when a pattern connecting the drain electrodes DT (including the source electrodes ST) is cut by the hole forming step of the terminal region TRM that is a step after the formation of the pixel electrode PX, the through hole TH extending from the capacitor insulating film CI to the insulating film IN1 is formed. In the cutting step, only the drain electrodes DT and the source electrodes ST that have to be separated from one another in view of the original circuit operation are cut. As shown in FIG. 9, therefore, the through hole TH is formed in a region where a pattern for other signals is not formed on the upper surface of the pattern wiring at the cutting portion, and only the drain electrodes DT and the source electrodes ST that have to be separated from one another in view of the original circuit operation are cut.

In this case, the wiring connecting the drain electrodes DT and the source electrodes ST of the thin film transistors TFT1 to 12 adjacent to one another is formed in Step 2 described in Embodiment 1. The formation of the through hole HL by which only the drain electrodes DT and the source electrodes ST that have to be separated from one another in view of the original circuit operation are cut is performed in Step 5 similarly to Embodiment 1. Here, semiconductor layers PS2 in FIG. 9 are high concentration layers for connecting the semiconductor layer PS with the drain electrode DT and the source electrode ST as metal thin films.

As described above, in the display device of Embodiment 2 of the invention, when the plurality of thin film transistors TFT forming the drive circuit DR are formed, not only a first wiring connecting the drain electrodes DT and the source electrodes ST of the thin film transistors that are originally connected but also a second wiring electrically and physically connecting the drain electrodes DT and/or the source electrodes ST of the thin film transistors adjacent to one another in the forming region of the drive circuit are formed in an outside region of the display region AR in Step 2. In Step 5 as a step after the formation of the thin film transistors TFT, the second wiring connecting the drain electrodes DT and/or the source electrodes ST of the thin film transistors adjacent to one another in the forming region of the drive circuit is cut in the forming region of the drive circuit DR as the outside region of the display region AR. Therefore, it is possible to reduce regions electrically independent from one another in the forming steps of the thin films in Steps 3 and 4. As a result, the breakdown of the thin film transistor TFT due to static electricity can be prevented. Accordingly, the manufacturing yield of the display device as a product can be improved.

Further in Step 5 of forming the hole of the terminal region TRM before the cut-off step in the manufacturing stage of the liquid crystal display device, the second wiring connecting the drain electrodes DT and/or the source electrodes ST of the thin film transistors adjacent to one another is cut. Therefore, a circuit operation test can be performed before the cut-off step.

In the display devices of Embodiments 1 and 2 described above, the pattern connecting the gate electrodes or the drain electrodes and the source electrodes of the thin film transistors adjacent to one another in the forming region of the drive circuit is formed to connect the gate electrodes or the drain electrodes and the source electrodes. However, a wiring pattern for leading out may be formed outside the forming region of the drive circuit to connect the gate electrodes GT or the drain electrodes and the source electrodes outside the forming region of the drive circuit.

In the display device of Embodiment 1, in the wiring pattern connecting the gate electrodes, the through hole TH is formed at the crossing portion of the wiring pattern so that one through hole TH can separate more thin film transistors. However, the forming portion of the through hole TH is not limited to the crossing portion. The through hole TH may be formed in a region in the middle of the wiring pattern other than the crossing portion.

Further in the liquid crystal display devices of Embodiments 1 and 2, only the gate electrodes or the drain electrodes and the source electrodes of the thin film transistors constituting the drive circuit are connected. In the scanning signal drive circuit, however, the gate line GL connected to the gate electrode of the thin film transistor for switching formed in each pixel is wired. Therefore, such an excellent effect can be provided that, for example, only by connecting the gate electrode of the thin film transistor constituting the scanning signal drive circuit with the gate line GL in the forming region of the scanning line drive circuit, the gate electrode of the thin film transistor in the display region AR and the gate electrode of the scanning line drive circuit can be connected to each other. Therefore, breakdown of a thin film transistor due to static electricity can be further prevented. Similarly, such an excellent effect can be provided that, for example, only by connecting the drain electrodes to one another of the thin film transistors connected to each of the drain lines DL in the forming region of the video signal drive circuit, the drain electrodes of the thin film transistors in the display region AR can be connected to one another. Therefore, breakdown of a thin film transistor due to static electricity can be further prevented.

The invention is not limited to the liquid crystal display device, but can be applied to other display devices such as organic EL display devices or inorganic EL display devices in which pixels are formed in a matrix above a first substrate.

What is claimed is:

1. A manufacturing method of a display device including, in an outside region surrounding a display region comprised of an assembly of pixels, a drive unit for supplying the pixels with a drive signal and an electrode terminal for inputting a control signal from the outside to the drive unit, the method comprising:
in forming a plurality of thin film transistors of the drive unit:
forming a first wiring that is connected to gate electrodes of the thin film transistors to cause the thin film transistors to perform a generating operation of the drive signal and forming a second wiring that connects the gate electrodes of the thin film transistors adjacent to one another, to provide a series connection between the gate electrodes of adjacent thin film transistors when the second wiring is uncut, in a forming region of the drive unit, said second wiring being formed in the same layer as the first wiring; and
cutting the second wiring to disrupt the series connection of the gate electrodes of adjacent thin film transistors by the second wiring after forming the thin film transistors in the outside region of the display region.

2. The manufacturing method of the display device according to claim 1, wherein
the second wiring is cut in forming a through hole in an insulating film formed on the electrode terminal so as to extend to the electrode.

3. The manufacturing method of the display device according to claim 1 or 2, wherein
the thin film transistor has a bottom gate structure in which a semiconductor layer is formed above a gate electrode, and the second wiring includes a wiring that connects the gate electrodes.

4. The manufacturing method of the display device according to claim 1 or 2, wherein
the second wiring includes a wiring that is connected to drain electrodes or source electrodes of the thin film transistors.

5. A display device including, in an outside region surrounding a display region comprised of an assembly of pixels, a drive unit for supplying the pixels with a drive signal and an electrode terminal for inputting a control signal from the outside to the drive unit, comprising:
a first wiring that is connected to gate electrodes of the thin film transistors of the drive unit configured to cause the thin film transistors to perform a generating operation of the drive signal and a second wiring extending between gate electrodes of the thin film transistors adjacent to one another, to provide a series connection between the gate electrodes of adjacent thin film transistors when the second wiring is uncut, in the forming region of the drive unit, wherein the second wiring is formed in the same layer as the first wiring; and
a through hole that extends from an insulating film formed on the second wiring to the second wiring, wherein
the second wiring is cut by the through hole to disrupt the series connection between the gate electrodes of the adjacent thin film transistors by the second wiring.

* * * * *